(12) United States Patent
Lim et al.

(10) Patent No.: US 8,476,155 B1
(45) Date of Patent: Jul. 2, 2013

(54) FORMATION OF A HIGH-K CRYSTALLINE DIELECTRIC COMPOSITION

(75) Inventors: Ha-Jin Lim, Seoul (KR); Weon-Hong Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 373 days.

(21) Appl. No.: 12/835,790

(22) Filed: Jul. 14, 2010

(51) Int. Cl.
*H01L 21/20* (2006.01)

(52) U.S. Cl.
USPC .................................. 438/584; 257/E29.255

(58) Field of Classification Search
USPC .................................. 438/584; 257/E29.255
See application file for complete search history.

(56) References Cited

U.S. PATENT DOCUMENTS

| | | | |
|---|---|---|---|
| 7,183,604 B2 | 2/2007 | Cartier et al. | |
| 2005/0167768 A1* | 8/2005 | Yamaguchi | 257/410 |
| 2006/0267066 A1 | 11/2006 | Li et al. | |
| 2007/0212895 A1* | 9/2007 | Chua et al. | 438/758 |
| 2008/0116543 A1* | 5/2008 | Govindarajan | 257/639 |
| 2008/0164582 A1* | 7/2008 | Govindarajan | 257/635 |
| 2009/0078990 A1* | 3/2009 | Yasuda | 257/326 |
| 2009/0134465 A1* | 5/2009 | Shimizu | 257/368 |
| 2009/0194797 A1* | 8/2009 | Shimizu et al. | 257/288 |

FOREIGN PATENT DOCUMENTS

| | | |
|---|---|---|
| JP | 2005322900 | 11/2005 |
| JP | 2006093240 | 4/2006 |
| KR | 1020070089521 | 8/2007 |

* cited by examiner

*Primary Examiner* — David Vu
*Assistant Examiner* — Duy T Nguyen
(74) *Attorney, Agent, or Firm* — Onello & Mello, LLP

(57) ABSTRACT

Provided are a method of forming a dielectric and a method of fabricating a semiconductor device. The method includes forming a preliminary dielectric including Hf, O and an "A" element on an underlying layer. The preliminary dielectric is formed in an amorphous structure or a mixed structure of an amorphous structure and an "M" crystalline structure. The "A" element about 1 at % to about 5 at % of the total content of the "A" element and Hf in the preliminary dielectric. Through a nitridation process, nitrogen is added to the preliminary dielectric. The nitrogen-containing dielectric is changed into a dielectric having a "T" crystalline structure through a phase transition process, wherein the "T" crystalline structure is different from the "M" crystalline structure. An upper layer is formed on the "T" crystalline dielectric.

17 Claims, 14 Drawing Sheets

FORMATION OF A HIGH-K CRYSTALLINE DIELECTRIC COMPOSITION

CROSS-REFERENCE TO RELATED APPLICATION

Background

1. Field

Embodiments of the inventive concept relate to a method of forming a high-k dielectric and a method of fabricating a semiconductor device using the same.

2. Description of Related Art

A dielectric having a high dielectric constant, k, is a critical factor in fabricating a semiconductor device.

SUMMARY

Embodiments of the inventive concept provide a method of forming a high-k dielectric.

Embodiments of the inventive concept also provide a method of fabricating a semiconductor device having a high-k dielectric.

In accordance with an aspect of the inventive concept, a method of fabricating a semiconductor device includes forming a preliminary dielectric including hafnium (Hf), oxygen (O) and an "A" element on an underlying layer. The preliminary dielectric is formed in an amorphous structure or in a mixed structure of an amorphous structure and an "M" crystalline structure. The "A" element constitutes about 1 atomic percent (at %) to about 5 atomic percent (at %) of the total content of the "A" element and Hf in the preliminary dielectric. Through a nitridation process, nitrogen is added to the preliminary dielectric. The nitrogen-containing dielectric is changed into a dielectric having a "T" crystalline structure through a phase-transition process, wherein the "T" crystalline structure is different from the "M" crystalline structure. On the "T" crystalline dielectric, an upper layer is formed.

In some embodiments, the "A" element may include at least one of silicon (Si), yttrium (Y), gadolinium (Gd), aluminum (Al), and zirconium (Zr).

In another embodiment, the "M" crystalline structure may be a monoclinic crystalline structure.

In still another embodiment, the "T" crystalline structure may be a tetragonal or cubic crystalline structure.

In still another embodiment, the phase transition process may be performed at about 700° C. to about 1100° C.

In yet another embodiment, before forming the preliminary dielectric, a buffer layer may be further formed on the underlying layer. The buffer layer may include silicon oxide or silicon oxynitride.

In yet another embodiment, before forming the upper layer, a capping layer may be further formed on the dielectric.

In yet another embodiment, before forming the preliminary dielectric, an amorphous lower dielectric may be further formed on the underlying layer. Here, the lower dielectric may include Hf, O and a "B" element, wherein the "B" element may include at least one of silicon (Si), yttrium (Y), gadolinium (Gd), aluminum (Al), and zirconium (Zr). The content of the "B" element as a percentage of the total content of Hf and the "B" element in the lower dielectric may be higher than the content of the "A" element as a percentage of the total content of Hf and the "A" element in the dielectric, and the lower dielectric may still maintain an amorphous structure during and after the phase-transition process.

In addition, the content of the "B" element may constitute 20 at % to about 50 at % of the total content of Hf and the "B" element in the lower dielectric.

During the nitridation process, nitrogen may be implanted or doped into the lower dielectric.

In yet another embodiment, before forming the upper layer, an amorphous upper dielectric may be formed on the dielectric. Here, the upper dielectric includes Hf, O, and a "C" element. During the nitridation process, nitrogen may be implanted or doped into the upper dielectric, thereby forming a nitrogen-containing upper dielectric. The "C" element may include at least one of Si, Y, Gd, Al, and Zr. The content of the "C" element as a fraction of the total content of Hf and the "C" element in the upper dielectric may be higher than the content of the "A" element as a fraction of the total content of Hf and the "A" element in the dielectric. During and after the phase-transition process, the upper dielectric may maintain an amorphous structure. Here, the content of the "C" element may constitute 20 at % to about 50 at % of the total content of Hf and the "C" element in the upper dielectric.

In yet another embodiment, before forming the preliminary dielectric, an amorphous lower dielectric may be formed on the underlying layer; and before forming the upper layer, an amorphous upper dielectric may be formed on the dielectric. During the nitridation process, nitrogen may be implanted or doped into the lower and upper dielectrics, and during and after the phase-transition process, the lower and upper dielectrics may maintain amorphous structures.

In yet another embodiment, the underlying layer may include a semiconductor region, and at least a part of the semiconductor region may overlap the dielectric. The upper layer may be formed of a conductive material.

In yet another embodiment, the underlying layer may be formed of a first conductive material, and the upper layer may be formed of a second conductive material that is different from the first conductive material.

In accordance with another aspect of the inventive concept, a method of forming a dielectric includes forming a preliminary dielectric in an amorphous structure or in a mixed structure of an amorphous structure and a monoclinic crystalline structure. The preliminary dielectric includes Hf, O, N and an "A" element, wherein the "A" element includes at least one of Si, Y, Gd, Al and Zr. Through a phase-transition process, the nitrogen-containing preliminary dielectric is formed into a dielectric having a tetragonal or cubic crystalline structure.

In some embodiments, the content of the "A" element may constitute 1% to about 5% of the total content of Hf and the "A" element in the preliminary dielectric.

In accordance with still another aspect of the inventive concept, a method of forming a HfSiON dielectric includes forming a HfSiO layer in an amorphous structure or in a mixed structure of an amorphous structure and a monoclinic phase. Here, the Si content is about 1 at % to about 5 at % of the total content of Hf and Si in the HfSiO layer. Through the nitridation process, nitrogen is added to the HfSiO layer, thereby forming a HfSiON layer. Through a phase transition process, the amorphous HfSiON layer is changed into a HfSiON layer having a tetragonal crystalline structure. Thus, in the tetragonal HfSiON layer, a monoclinic crystalline structure does not exist.

In some embodiments, before or after forming the HfSiO layer, an amorphous barrier HfSiO layer may be formed, and during the nitridation process, nitrogen may be added to the barrier HfSiO layer, thereby forming a barrier HfSiON layer. The barrier HfSiON layer may maintain an amorphous structure during and after the phase transition process, and the Si content as a percentage of the total content of Hf and Si in the barrier HfSiON layer may be higher than the Si content as a percentage of the total content of Hf and Si in the tetragonal HfSiON layer.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EMBODIMENTS

Figure 1A:
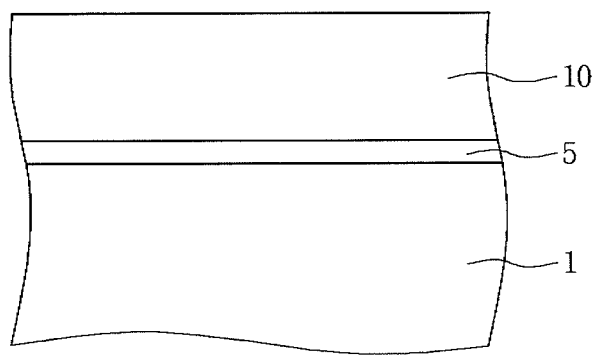
FIGS. 1A through 1D are cross-sectional views illustrating a method of fabricating a semiconductor device according to an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided to convey inventive concepts to those skilled in the art. In the drawings, the absolute and relative sizes of layers and regions may be exaggerated for clarity.

It will be understood that when an element or layer is referred to as being "on," "connected to" or "coupled to" another element or layer, it can be directly on, connected or coupled to the other element, or one or more intervening elements or layers may be present. In contrast, when an element is referred to as being "directly on," "directly connected to" or "directly coupled to" another element or layer, there are no intervening elements or layers present. Like numerals refer to like elements throughout. As used herein, the term, "and/or," includes any and all combinations of one or more of the associated listed items.

It will be understood that, although the terms, first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term, "below," can encompass both an orientation of above and below. The device may be otherwise oriented (rotated 90 degrees or at other orientations), and the spatially relative descriptors used herein is to be interpreted accordingly.

The terminology used herein is for the purpose of describing particular embodiments only and is not intended to be limiting of the present inventive concept. As used herein, the singular forms, "a," "an" and "the," are intended to include the plural forms as well, unless the context clearly indicates otherwise. It will be further understood that the terms, "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as being limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, and their shapes are not intended to illustrate the actual shape of a region of a device and are not intended to limit the scope of the inventive concepts.

Unless otherwise defined, all terms (including technical and scientific terms) used herein have a meaning that is the same as that which is commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
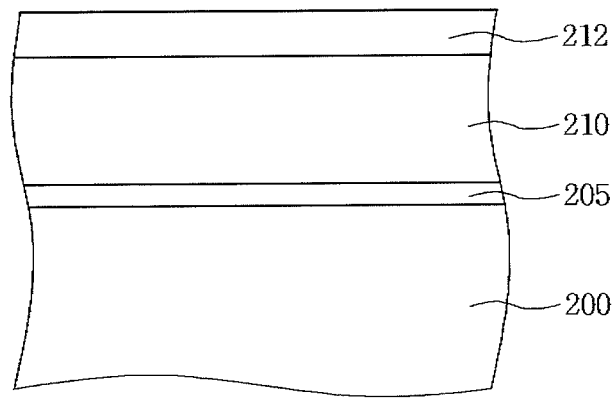
FIGS. 3A through 3C are cross-sectional views illustrating a method of fabricating a semiconductor device according to still another embodiment of the inventive concept.
Figure 3B:
Figure 3B:
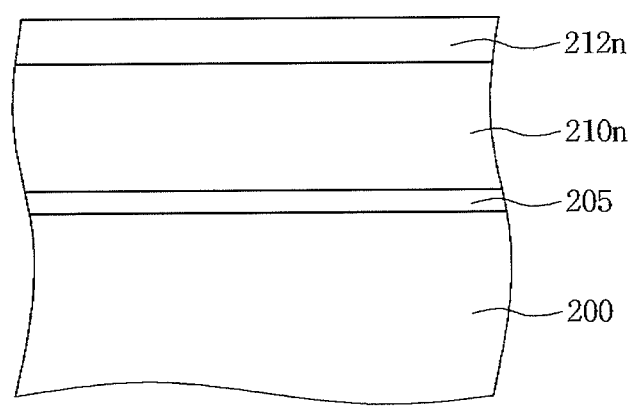
Figure 3C:
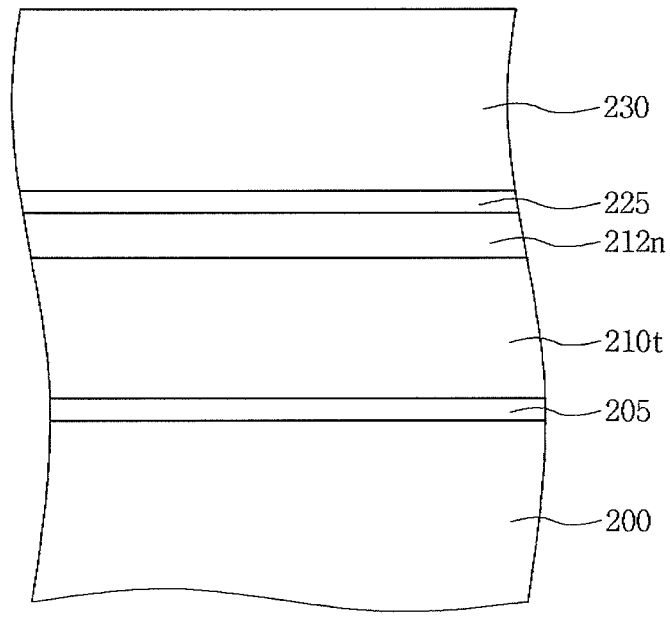
Figure 4A:
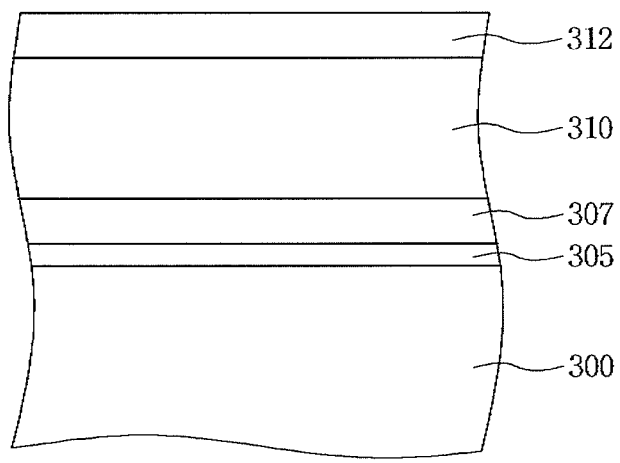
FIGS. 4A through 4C are cross-sectional views illustrating a method of fabricating a semiconductor device according to yet another embodiment of the inventive concept.
Figure 4B:
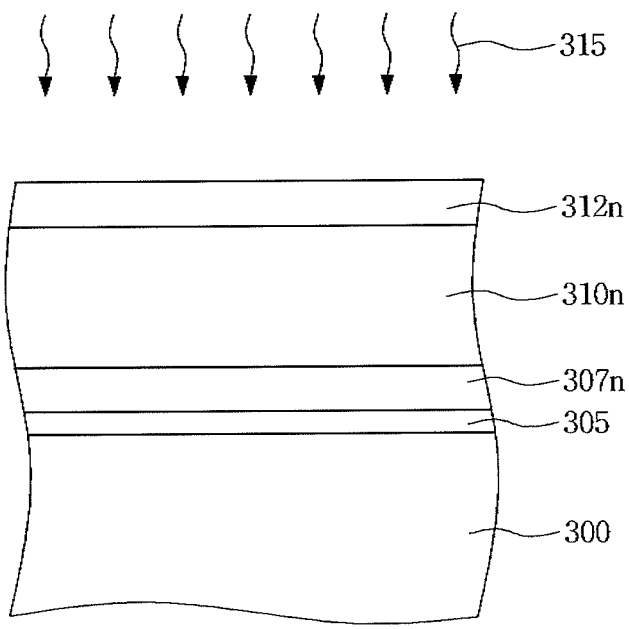
Figure 4C:
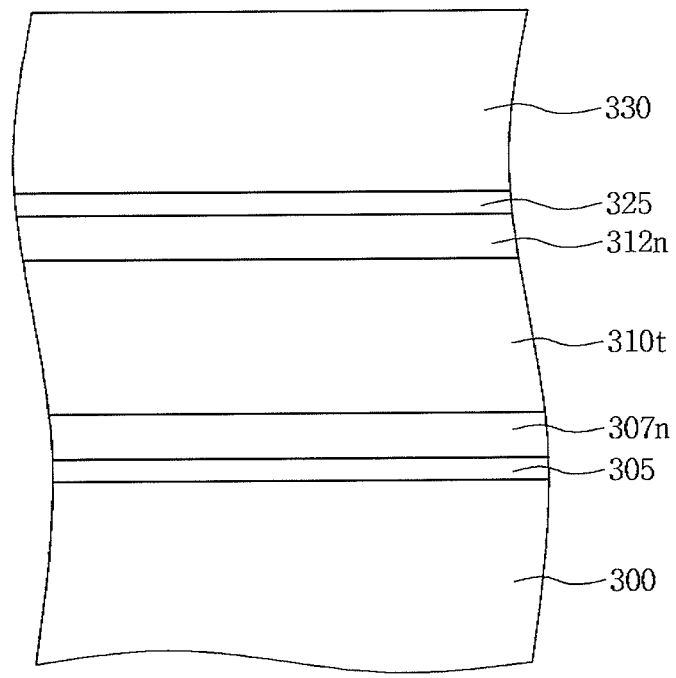

FIGS. 1A through 1D are cross-sectional views illustrating a method of fabricating a semiconductor device according to an embodiment of the inventive concept; FIGS. 2A through 2D are cross-sectional views illustrating a method of fabricating a semiconductor device according to another embodiment of the inventive concept; FIGS. 3A through 3C are cross-sectional views illustrating a method of fabricating a semiconductor device according to still another embodiment of the inventive concept; and FIGS. 4A through 4C are cross-sectional views illustrating a method of fabricating a semiconductor device according to yet another embodiment of the inventive concept.

First, a method of fabricating a semiconductor device according to an embodiment of the inventive concept will be described with reference to FIGS. 1A through 1D.

Referring to FIG. 1A, an underlying layer 1 may be formed on or in a semiconductor substrate. The underlying layer 1 may be a semiconductor region to form a metal oxide semiconductor (MOS) transistor. For example, the underlying layer 1 may be a silicon region. Alternatively, the underlying layer 1 may be formed of a conductive material. For example, the underlying layer 1 may be a single layer formed of a conductive material, such as TaN, Ta, Ru, WSi, W, WSi, WN, Ti, TiN, TaTi, Ta Pt, TaSiN, TaTiN, HfN, TiAlN, Mo, Pt or doped silicon, or an alloy layer or a stacked layer formed of at least two of these conductive materials.

A buffer insulating layer 5 may be formed on the underlying layer 1. The buffer insulating layer 5 may be formed of silicon oxide and/or silicon oxynitride. When the underlying layer 1 is formed of a material such as silicon, the buffer insulating layer 5 may be formed using thermal oxidation. However, the inventive concept is not limited thereto, and the buffer insulating layer 5 may be formed using a deposition method such as CVD or ALD.

A preliminary dielectric 10 including hafnium (Hf), oxygen (O) and an "A" element may be formed on the buffer insulating layer 5. Here, the "A" element may include at least one of silicon (Si), yttrium (Y), gadolinium (Gd), aluminum (Al), and zirconium (Zr). For example, the preliminary dielectric 10 may be formed of a HfSiO layer.

The "A" element may constitute 1 atomic percent(at %) to about 5 atomic percent(at %) of the total content of the "A" element and Hf in the preliminary dielectric 10 ($[N_A]/\{[N_{Hf}]+[N_A]\}$). Here, $[N_A]$ is the content of the "A" element, and $[N_{Hf}]$ is the Hf content. That is, in the preliminary dielectric 10, when the total content of the "A" element and Hf is given as 100%, the content of the "A" element may be about 1 at % to about 5 at %, and the Hf content may be about 95 at % to about 99 at %.

In some embodiments, the preliminary dielectric 10 may have an amorphous structure or an "M" crystalline structure.

In another embodiment, the preliminary dielectric 10 may have a mixed structure of the amorphous structure and the "M" crystalline structure. Here, the "M" crystalline structure may be a monoclinic crystalline structure.

Figure 1B:
Figure 1B:

Referring to FIG. 1B, a nitridation process 15 for adding nitrogen to the preliminary dielectric 10 of FIG. 1A may be performed, thereby forming a nitrogen-containing preliminary dielectric 10n.

The nitridation process 15 may be performed using annealing, plasma nitridation or ion implantation. For example, the nitridation process 15 may be performed in $N_2$, $NH_3$ or NO gas using plasma, radical or thermal energy. Alternatively, the nitridation process 15 may be ion implantation to implant nitrogen (N) or nitrogen molecules ($N_2$) into the preliminary dielectric 10.

Figure 1C:

Referring to FIG. 1C, a phase transition process 20 (e.g., an annealing process) may be performed on the nitrogen-containing preliminary dielectric 10n, thereby forming a main dielectric 10t having a "T" crystalline structure. The "T" crystalline structure may be a tetragonal or cubic crystalline structure. The "T" crystalline structure may be different from the "M" crystalline structure and may be more thermally stable than the "M" crystalline structure. The "M" crystalline structure may not remain in the main dielectric 10t. For example, by the phase transition process 20, the phase of the nitrogen-containing preliminary dielectric 10n may be changed into the main dielectric 10t having the "T" crystalline structure, either as a "T" crystalline single phase or as a mixed structure of a "T" crystalline structure and an amorphous structure.

The dielectric constant of the "T"-crystalline main dielectric 10t may be increased when it is changed into a "T" crystalline structure. That is, the "T"-crystalline main dielectric 10t may have a higher dielectric constant than the amorphous and/or "M" crystalline preliminary dielectric 10n.

In some embodiments, the phase transition process 20 may be an annealing process performed at about 700° C. to about 1100° C.

In another embodiment, the phase transition process 20 may be an annealing process performed at about 900° C. to about 1100° C.

The main dielectric 10t may include Hf, O, N, and an "A" element. Here, the "A" element may include at least one of Si Y, Gd, Al and Zr. For example, the main dielectric 10t may be formed of a tetragonal or cubic HfSiON layer. In the main dielectric 10t, the "A" element may constitute 1 at % to about 5 at % of the total content of the "A" element and Hf.

Figure 1D:
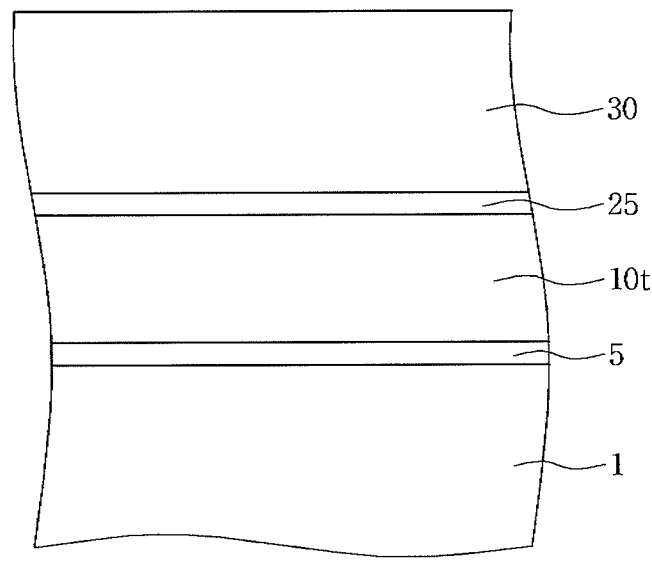

Referring to FIG. 1D, a capping layer 25 may be formed on the dielectric 10t. The capping layer 25 may be an insulating layer having a dielectric constant that is different from that of the main dielectric 10t. The capping layer 25 may be formed of an insulating material, such as silicon oxide ($SiO_2$) or aluminum oxide ($Al_2O_3$) having a great energy band gap to raise an energy barrier of leakage current. In some embodiments, the phase transition process 20 described in FIG. 1C may be performed after the capping layer 25 is formed.

An upper layer 30 may be formed on the capping layer 25. The upper layer 30 may be formed of a conductive material. The upper layer 30 may be a single layer formed of a conductive material, such as TaN, Ta, Ru, WSi, W, WSi, WN, Ti, TiN, TaTi, TaPt, TaSiN, TaTiN, HfN, TiAlN, Mo, Pt or doped polysilicon, or an alloy layer or a stacked layer formed of at least two of these conductive materials.

A method of fabricating a semiconductor device according to another embodiment of the inventive concept will be described with reference to FIGS. 2A through 2D.

Figure 2A:
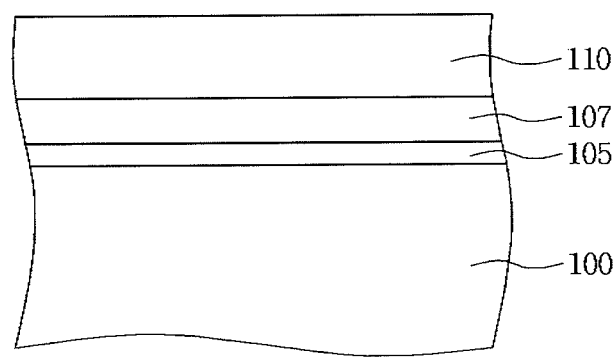
FIGS. 2A through 2D are cross-sectional views illustrating a method of fabricating a semiconductor device according to another embodiment of the inventive concept.

Referring to FIG. 2A, as described in FIG. 1A, an underlying layer 100 may be formed on or in a semiconductor substrate. The underlying layer 100 may be formed of a semiconductor or conductive material. A buffer insulating layer 105 may be formed on the underlying layer 100. The buffer insulating layer 105 may be formed of SiO and/or SiON.

A lower dielectric 107 may be formed on the buffer insulating layer 105. The lower dielectric 107 may have an amorphous structure. The lower dielectric 107 may include a "B" element. The "B" element may include at least one of Si, Y, Gd, Al and Zr. The "B" element in the lower dielectric 110 may be sufficiently contained to prevent crystallization of the amorphous lower dielectric 110 due to a subsequent annealing process. For example, "B" element may constitute about 20 at % to about 50 at % of the total content of the "B" element and Hf in the lower dielectric 107 ($[N_B]/\{[N_{Hf}]+[N_B]\}$). Here, $[N_B]$ may be the content of "B," and $[N_{Hf}]$ may be the content of Hf.

In some embodiments, the lower dielectric 107 may include Hf, O, and the "B" element. For example, the lower dielectric 107 may be formed of a HfSiO layer.

In another embodiment, the lower dielectric 107 may include Hf, O, N, and the "B" element. For example, the lower dielectric 107 may be formed of a HfSiON layer.

A preliminary dielectric 110 may be formed on the lower dielectric 107. The preliminary dielectric 110 may have an amorphous structure or a mixed structure of an amorphous structure and an "M" crystalline structure. Here, the "M" crystalline structure may be a monoclinic crystalline structure.

Figure 2B:
Figure 2B:
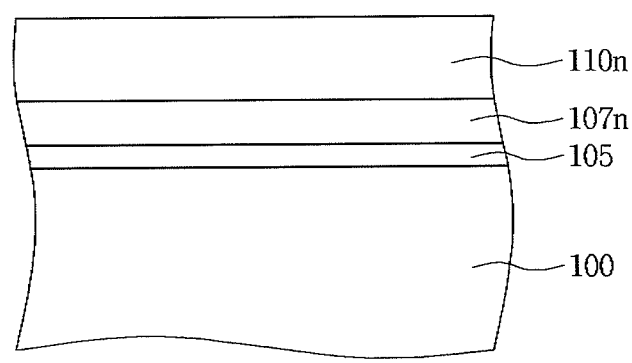

Referring to FIG. 2B, as shown in FIG. 1B, a nitridation process 115 for adding a nitrogen element to the preliminary dielectric 110 of FIG. 2A may be performed, thereby forming a nitrogen-containing preliminary dielectric 110n. The nitridation process 115 may be performed using annealing plasma nitridation or ion implantation.

In some embodiments, during the nitridation process 115, nitrogen may be added to the lower dielectric 107, thereby forming a nitrogen-containing lower dielectric 107n. For example, when the lower dielectric 107 is formed of a HfSiO layer, the HfSiO layer may be formed into a HfSiON layer 107n through the nitridation process 115. Alternatively, during the nitridation process 115, nitrogen may not be added to the lower dielectric 107.

Figure 2C:
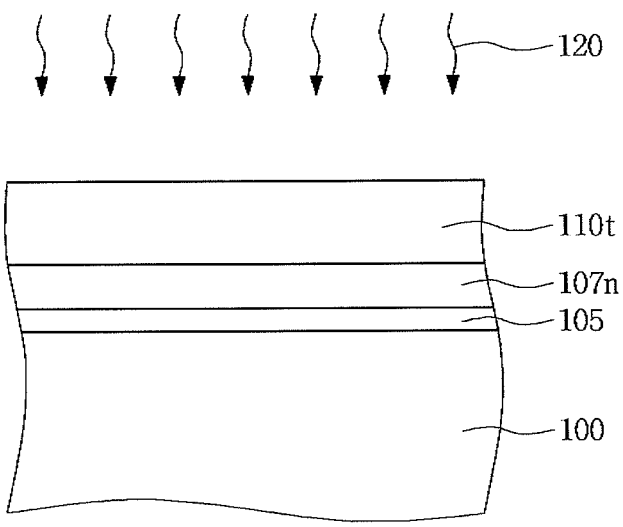

Referring to FIG. 2C, through a phase transition process 120, the nitrified preliminary dielectric 110n may be changed into a main dielectric 110t having a "T" crystalline structure. Here, the main dielectric 110t may have a "T" crystalline single phase or may have a mixed structure of a "T" crystalline structure and an amorphous structure. The phase transition process 120 may be an annealing process. For example, the phase transition process 120 may be performed at a temperature that can change the nitride-containing preliminary dielectric 110n into the "T" crystalline main dielectric 110t, such that there is no "M" crystalline structure. In a particular example, the phase transition process 120 may be an annealing process performed at about 700° C. to about 1100° C. In a more particular example, the phase transition process 120 may be an annealing process performed at about 900° C. to about 1100° C.

The "T" crystalline structure may be different from the "M" crystalline structure, and may be more thermally stable than the "M" crystalline structure. The "T" crystalline structure may, for example, be a tetragonal or cubic crystalline structure. The main dielectric 110t may have a dielectric constant that is higher than that of the lower dielectric 107n.

The main dielectric 110t may include Hf, O, N, and an "A" element. Here, the "A" element may include at least one of Si, Y, Gd, Al, and Zr. For example, the main dielectric 110t may be formed of a tetragonal or cubic HfSiON layer. The main dielectric 110t is substantially the same as the main dielectric 10t described in FIG. 1C, and thus a detailed description thereof will be omitted.

Figure 2D:
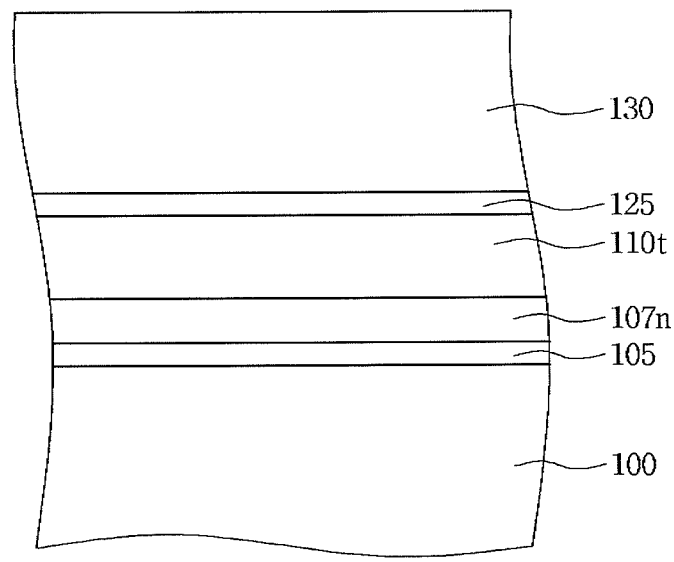

Referring to FIG. 2D, a capping layer 125 may be formed on the main dielectric 110t. In some embodiments, the phase transition process 120 described in FIG. 2C may be performed after the capping layer 125 is formed. An upper layer 130 may be formed on the capping layer 125. The capping layer 125 and the upper layer 130 may be formed by the same method as described with reference to FIG. 1D to form the capping layer 25 and the upper layer 30.

During and after the phase transition process 120, the lower dielectric 107n may have an amorphous structure. The lower dielectric 107n having an amorphous structure, which is formed before the phase transition process 120, may still maintain the amorphous structure during and after the phase transition process 120. Here, the "B" element may constitute 20 at % to about 50 at % of the total content of the "B" element and Hf in the lower dielectric 107n. The content of the "B" element of the total content of Hf and the "B" element in the amorphous lower dielectric 107n may be higher than the content of the "A" element of the total content of Hf and the "A" element in the main dielectric 110t.

This content of the "B" element may inhibit crystallization of the lower dielectric 107n during the phase transition process. The amorphous lower dielectric 107n has a better leakage current characteristic than the tetragonal or cubic main dielectric 110t. Thus, the lower dielectric 107n may serve as a barrier blocking leakage current between the upper layer 130 and the underlying layer 100.

A method of fabricating a semiconductor device and a semiconductor device fabricated thereby according to still another embodiment of the inventive concept will be described with reference to FIGS. 3A through 3C.

Referring to FIG. 3A, as described in FIG. 1A, an underlying layer 200 may be formed on or in a semiconductor substrate. The underlying layer 200 may be formed of a semiconductor or conductive material. A buffer insulating layer 205 may be formed on the underlying layer 200. The buffer insulating layer 205 may be formed of SiO and/or SiON.

A preliminary dielectric 210 including Hf, O, and an "A" element may be formed on the buffer insulating layer 205. Here, the "A" element may include at least one of Si, Y, Gd, Al, and Zr. The preliminary dielectric 210 may be formed using the same method and material as were used to form the preliminary dielectric 10 described in FIG. 1A. For example, the preliminary dielectric 210 may be formed of a HfSiO layer. The preliminary dielectric 210 may be formed in an amorphous structure, an "M" crystalline structure, or a mixed structure thereof. Here, the "M" crystalline structure may be a monoclinic crystalline structure.

An upper dielectric 212 may be formed on the preliminary dielectric 210. The upper dielectric 212 may have an amorphous structure. The upper dielectric 107 may include a "C" element. The "C" element may include at least one of Si, Y, Gd, Al, and Zr. The "C" element in the upper dielectric may serve to prevent crystallization of the upper dielectric 212 having an amorphous structure through a subsequent thermal process. The upper dielectric 212 may include Hf, O, and the "C" element. For example, the upper dielectric 107 may be formed of a HfSiO layer.

The "C" element may constitute 20 at % to about 50 at % of the total content of the "C" element and Hf in the upper dielectric 212.

Referring to FIG. 3B, through a nitridation process 215, nitrogen may be included in the upper dielectric 212 and in the preliminary dielectric 210. Thus, an upper dielectric 212n containing nitrogen and a preliminary dielectric 210n containing nitrogen may be formed. The nitridation process 215 may be substantially the same process as the nitridation process 115 described in FIG. 2B.

Referring to FIG. 3C, through the phase transition process as described in FIG. 2C, the nitrogen-containing preliminary dielectric 210n may be changed into the main dielectric 210t having a "T" crystalline structure. The "T" crystalline structure may be different from the "M" crystalline structure and may be more thermally stable structure than the "M" crystalline structure. For example, the "T" crystalline structure may be a tetragonal or cubic crystalline structure. The main dielectric 210t may have a higher dielectric constant than the upper dielectric 212n.

The main dielectric 210t may include Hf, O, N, and the "A" element. Here, the "A" element may include at least one of Si Y, Gd, Al, and Zr. For example, the main dielectric 210t may be formed of a HfSiON layer having a tetragonal or cubic structure. That is, the main dielectric 210t is substantially the same as the main dielectric 10t described in FIG. 1C, and thus a detailed description thereof will be omitted.

A capping layer 225 may be formed on the upper dielectric 212n, and an upper layer 230 may be formed on the capping layer 225.

In some embodiments, the phase transition process changing the nitrogen-containing preliminary dielectric 210n into the main dielectric 210t having the "T" crystalline structure may be performed after the capping layer 225 is formed.

An upper layer 230 may be formed on the capping layer 225. The capping layer 225 and the upper layer 230 may be formed by the same method described with reference to FIG. 1D to form the capping layer 25 and the upper layer 30.

During and after the phase transition process, the upper dielectric 212n may have an amorphous structure. The amorphous upper dielectric 212n formed before the phase transition process may still have the amorphous structure during and after the phase transition process. Here, in the upper dielectric 212n, the "C" element may constitute 20 at % to about 50 at % of the total content of the "C" element and Hf, and such a content of the "C" element may inhibit crystallization of the upper dielectric 212n during the phase transition process. The amorphous upper dielectric 212n may have a better leakage current characteristic than the tetragonal or cubic main dielectric 210t. Thus, the upper dielectric 212n may serve as a barrier blocking leakage current between the underlying layer 200 and the upper layer 230.

A method of fabricating a semiconductor device according to yet another embodiment of the inventive concept will be described with reference to FIGS. 4A through 4C.

Referring to FIG. 4A, as described in FIG. 2A, an underlying layer 300, a buffer insulating layer 305, a lower dielectric layer 307, and a preliminary dielectric 310 may be formed. The underlying layer 300, the buffer insulating layer 305, the lower dielectric 307, and the preliminary dielectric 310 may correspond to the underlying layer 100, the buffer insulating layer 105, the lower dielectric 107, and the preliminary dielectric 110 described in FIG. 2A, respectively, and thus detailed descriptions thereof will be omitted. An upper dielectric 312 like the upper dielectric 212 described in FIG. 3A may be formed on the preliminary dielectric 310.

The preliminary dielectric 310 may include Hf, O, and an "A" element. Here, the "A" element may include at least one of Si, Y, Gd Al, and Zr. The preliminary dielectric 310 may be formed in an amorphous structure, an "M" crystalline structure, or a mixed structure thereof. The "M" crystalline structure may be a monoclinic crystalline structure. For example, the preliminary dielectric 310 may be formed of a HfSiO layer.

The lower dielectric 307 may have an amorphous structure and may include Hf, O, and the "B" element. The "B" element may include at least one of Si, Y, Gd, Al, and Zr. The upper dielectric 312 may have an amorphous structure, as well, and may include Hf, O, and the "C" element. The "C" element may include at least one of Si, Y, Gd, Al, and Zr.

Referring to FIG. 4B, through a nitridation process 315, nitrogen may be added to the preliminary dielectric 310. Thus, the preliminary dielectric 310 may be formed into a preliminary dielectric 310n including nitrogen. The nitridation process 315 may be performed using annealing, plasma nitridation, or ion implantation like the nitridation processes 5, 115, and 215 described above.

During the nitridation process 315, nitrogen may be included in the upper dielectric 312. Thus, the upper dielectric 312 may be formed into a nitrogen-containing upper dielectric 312n.

During the nitridation process 315, nitrogen may be included in the lower dielectric 307. Thus, the lower dielectric 307 may be formed into a nitrogen-containing lower dielectric 307n.

Referring to FIG. 4C, through a phase transition process as described in FIG. 2C, the amorphous and/or "M" crystalline preliminary dielectric 310n may be changed into a main dielectric 310t having a "T" crystalline structure. The "T" crystalline structure may be different from the "M" crystalline structure and may be more thermally stable than the "M" crystalline structure. For example, the "T" crystalline structure may be a tetragonal or cubic crystalline structure.

The main dielectric 310t may include Hf, O, N, and an "A" element. Here, the "A" element may include at least one of Si, Y, Gd, Al, and Zr. For example, the main dielectric 310t may be formed of a tetragonal or cubic HfSiON layer. That is, the main dielectric 310t may be substantially the same as the main dielectric 10t described in FIG. 1C.

The lower dielectric 307n may include Hf, O, N, and the "B" element. The "B" element may include at least one of Si, Y, Gd, Al, and Zr. Here, the "B" element may constitute 20 at % to about 50 at % of the total content of the "B" element and Hf in the lower dielectric 307n. This content of the "B" element may inhibit crystallization of the upper dielectric 212n during the phase transition process. For example, the lower dielectric 307n may be formed of an amorphous HfSiON layer, and the Si content in the amorphous HfSiON layer may be about 20 at % to about 50 at %.

The upper dielectric 312n may include Hf, O, N, and the "C" element. The "C" element may include at least one of Si, Y, Gd, Al, and Zr. Here, the "C" element may constitute about 20 at % to about 50 at % of the total content of the "C" element and Hf in the upper dielectric 312n. This content of the "C" element may inhibit crystallization of the upper dielectric 312n during the phase transition process. For example, the upper dielectric 312n may be formed of an amorphous HfSiON layer, in which, if a total content of "HfSi" is given as 100%, Hf may constitute about 50 at % to about 80 at %, and Si may constitute about 20 at % to about 50 at %.

A capping layer 325 may be formed on the upper dielectric 312n. The phase transition process may be performed before or after the capping layer 325 is formed. An upper layer 330 may be formed on the capping layer 325. The capping layer 325 and the upper layer 330 may be formed by the same method as described in FIG. 1D to form the capping layer 25 and the upper layer 30.

During or after the phase transition process, the upper dielectric 312n and the lower dielectric 307n may have amorphous structures. The upper dielectric 312n and the lower dielectric 307n having amorphous structures, which are formed before the phase transition process, may still have amorphous structures during and after the phase transition process. Thus, the upper dielectric 312n and the lower dielectric 307n may prevent leakage current between the underlying layer 300 and the upper layer 330.

The embodiments described in FIGS. 1A through 4C can be applied to form dielectrics for various semiconductor devices. For example, these embodiments may be applied to a method of forming a dielectric for a capacitor. More specifically, in a capacitor including a dielectric interposed between first and second capacitor electrodes facing each other, the underlying layer (1 of FIG. 1D, 100 of FIG. 2D, 200 of FIG. 3C, or 300 of FIG. 4C) may correspond to a first capacitor electrode, and the upper layer (30 of FIG. 1D, 130 of FIG. 2D, 230 of FIG. 3C, or 330 of FIG. 4C) may correspond to a second capacitor electrode. Thus, a dielectric of a capacitor may include the main dielectric 10t of FIG. 1D, or the lower dielectric 107n and the main dielectric 110t, which are sequentially stacked in FIG. 2D; the main dielectric 210t and the upper dielectric 212n, which are sequentially stacked in FIG. 3C; or the lower dielectric 307n, the main dielectric 310t and the upper dielectric 312n, which are sequentially stacked in FIG. 4D.

Meanwhile, the embodiments described in FIGS. 1A through 4C can be applied to form a capacitor, as described above, and also applied to a method of forming a gate dielectric of a MOS transistor and to a method of forming a dielectric of a flash memory device.

Hereinafter, a MOS transistor and a flash memory device will be described with reference to FIGS. 5 and 6.

Figure 5:
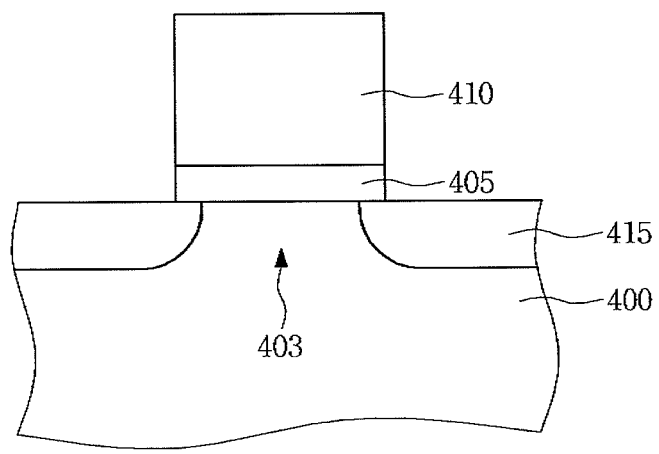
FIG. 5 is a cross-sectional view of a semiconductor device according to yet another embodiment of the inventive concept.

To begin with, referring to FIG. 5, a gate dielectric layer 405 and a gate electrode 410 sequentially stacked may be formed on a predetermined region of a semiconductor substrate 400. Source and drain regions 415 may be formed in the semiconductor substrate at either side of the gate electrode 410. Thus, a MOS transistor including the gate dielectric layer 405, the gate electrode 410 and the source and drain regions 415 may be provided. A semiconductor region 403 located under the gate dielectric layer 405 and between the source and drain regions 415 may be defined as a channel region of the MOS transistor.

The underlying layer (1 of FIG. 1D, 100 of FIG. 2D, 200 of FIG. 3C, or 300 of FIG. 4C) in one of the embodiments described in FIGS. 1A through 4C may correspond to the semiconductor region 403 under the gate dielectric layer 405, and the upper layer (30 of FIG. 1D, 130 of FIG. 2D, 230 of FIG. 3C, or 330 of FIG. 4C) in one of the embodiments described in FIGS. 1A through 4C may correspond to the gate electrode 410. Thus, the gate dielectric layer 405 may include the main dielectric 10t of FIG. 1D, the lower dielectric 107n and the main dielectric 110t, which are sequentially stacked in FIG. 2D, the main dielectric 210t and the upper dielectric 212n, which are sequentially stacked in FIG. 3C, or the lower dielectric 307n, the main dielectric 310t and the upper dielectric 312n, which are sequentially stacked in FIG. 4D.

Figure 6:
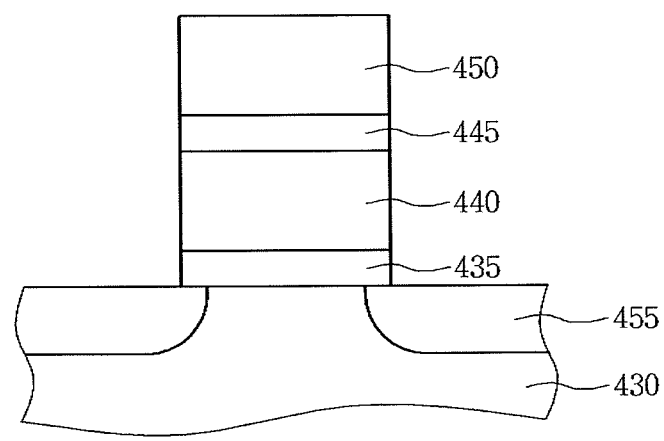
FIG. 6 is a cross-sectional view of a semiconductor device according to yet another embodiment of the inventive concept.

Next, referring to FIG. 6, a gate structure including a gate dielectric layer 435, a floating gate 440, an inter-gate dielectric layer 445 and a control gate 450, which are sequentially stacked, may be formed on a predetermined region of a semiconductor substrate 430. Impurity regions 455 may be formed in the semiconductor substrate 430 at either side of the gate structure.

The gate dielectric layer 435 may include the main dielectric 10t of FIG. 1D, the lower dielectric 107n and the main dielectric 110t, which are sequentially stacked in FIG. 2D, the main dielectric 210t and the upper dielectric 212n, which are sequentially stacked in FIG. 3C, or the lower dielectric 307n, the main dielectric 310t and the upper dielectric 312n, which are sequentially stacked in FIG. 4D.

The inter-gate dielectric layer 445 may include the main dielectric 10t of FIG. 1D, the lower dielectric 107n and the main dielectric 110t, which are sequentially stacked in FIG. 2D, the main dielectric 210t and the upper dielectric 212n, which are sequentially stacked in FIG. 3C, or the lower dielectric 307n, the main dielectric 310t and the upper dielectric 312n, which are sequentially stacked in FIG. 4D.

Experimental Example

Table 1 shows results of an experiment observing phase transition states according to Si content and annealing conditions. In Table 1, an "A sample" is a HfO layer having a Si content of 0%, and a "B sample" through an "E sample" are HfSiO layers. Here, the "B sample" is a sample in which Si constitutes 5 at % of the total content of Si and Hf; the "C sample" is a sample in which Si constitutes 6 at % of the total content of Si and Hf; the "D sample" is a sample in which Si constitutes 7 at % of the total content of Si and Hf; and the "E sample" is a sample in which Si constitutes 9 at % of the total content of Si and Hf.

Each sample was deposited to a thickness of about 100 Å, and a phase change according to a temperature change was analyzed by XRD. In Table 1, "M" means a monoclinic phase, and "T" means a tetragonal phase. In addition, "M(t)" means a mixed phase of a monoclinic phase and a tetragonal phase.

TABLE 1

| | | Phase according to Annealing Temperature | | | |
|---|---|---|---|---|---|
| | Si Content | Initial | 500° C. | 700° C. | 950° C. |
| A Sample | 0 at % | Amorphous | M(t) | M(t) | M |
| B Sample | 5 at % | Amorphous | Amorphous | M(t) | M |
| C Sample | 6 at % | Amorphous | Amorphous | T | M(t) |
| D Sample | 7 at % | Amorphous | Amorphous | T | T |
| E Sample | 9 at % | Amorphous | Amorphous | T | T |

Referring to Table 1, it can be seen that the "A sample" through the "E sample" are amorphous phases when they are initially deposited.

When the "A sample" through the "E sample" were annealed at 500° C., the "A sample" was a mixed phase of a monoclinic phase and a tetragonal phase, and other samples were amorphous phases.

When the "A sample" through the "E sample" were annealed at 700° C., the "A sample" and the "B sample" were mixed phases of a monoclinic phase and a tetragonal phase, and the "C sample" through the "E sample" were tetragonal phases.

When the "A sample" through the "E sample" were annealed at 950° C., the "A sample" and the "B sample" were monoclinic phases, the "C sample" was a mixed phase of a monoclinic phase and a tetragonal phase, and the "D sample" and the "E sample" were tetragonal phases.

Thus, it can be seen from Table 1 that the "D sample" and the "E sample" which have the Si contents of 7 at % or more are tetragonal phases.

Meanwhile, a HfSiO layer including silicon has better thermal stability than a HfO layer in which silicon is omitted. In addition, as the Si content in the HfSiO layer is increased, the dielectric constant of the layer is decreased and an Ion (ON current) characteristic is reduced.

The "D sample" and the "E sample" both have tetragonal phases; but the "D sample," which has a lower Si content, has a dielectric constant that is higher than that of the "E sample." While the "B sample" and the "C sample" have Si contents that are lower than that of the "E sample," they have monoclinic phases, which have unfavorable dielectric constants. For this reason, it cannot be said that the "B sample" is a better high-k dielectric than the "E sample" even though the "B sample" has a lower Si content.

Figure 7:
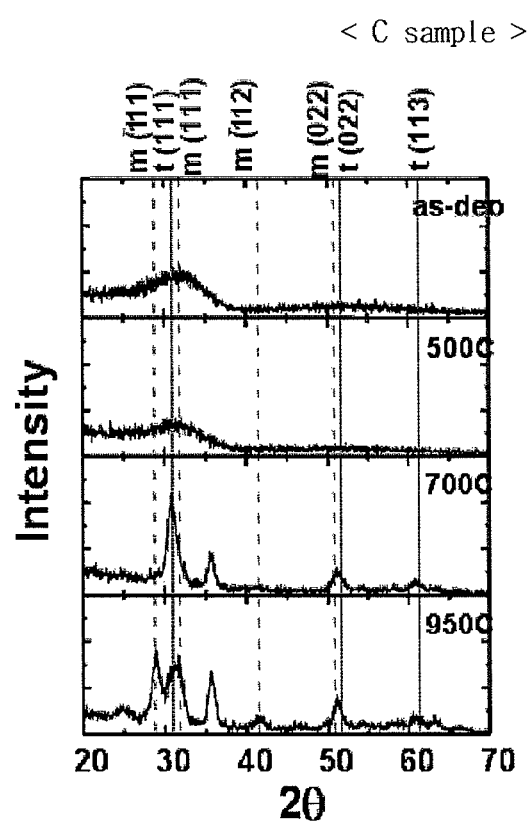
FIGS. 7 through 9 are graphs showing XRD analysis results of dielectrics according to embodiments of the inventive concept.

FIG. 7 shows an x-ray-diffraction (XRD) analysis result of the "C sample" in Table 1. Referring to FIG. 7, in the initial state and at 500° C., the "C sample" is an amorphous phase. Further, when the "C sample" is annealed at 700° C., the "C sample" is a tetragonal phase; but when the "C sample" is treated with 950° C., it is a mixed phase of a monoclinic phase and a tetragonal phase.

Figure 8:
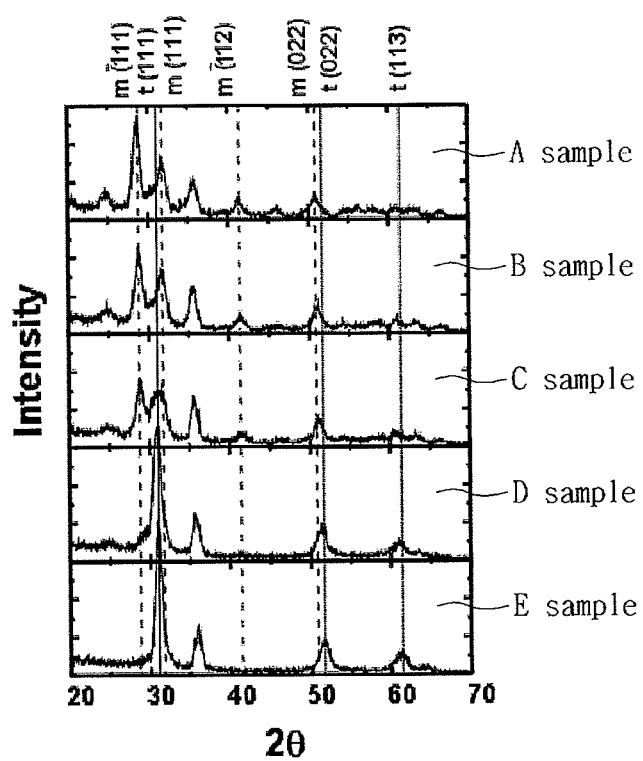

FIG. 8 is a graph showing XRD analysis results of the "A sample" through the "E sample" in Table 1, which are annealed at 950° C. for 30 seconds. As shown in FIG. 8 and Table 1, when the Si content is 7 at % or more, a tetragonal HfSiO layer can be formed.

Figure 9:
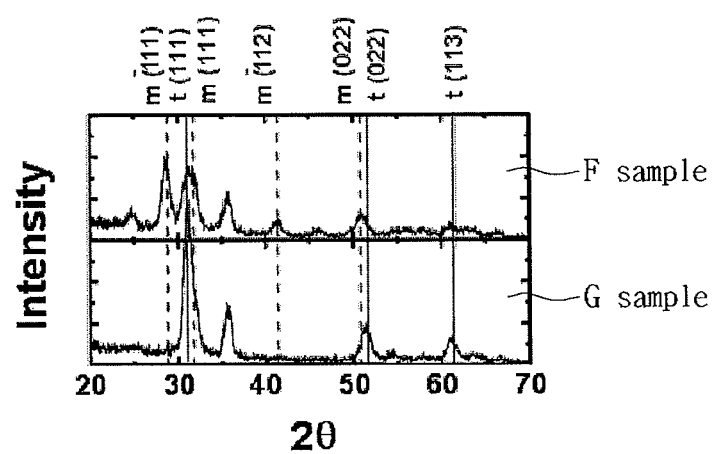

FIG. 9 is a graph showing XRD analysis results of the "F sample" and the "G sample". Here, the "F sample" is a HfON layer formed by a nitridation process performed on a HfO layer (from which Si is omitted) in $NH_3$ gas ambient at 750° C. for 60 seconds and by a phase transition process (that is, an annealing process) performed thereon at 950° C. for 30 seconds; and the "G sample" is a HfSiON layer formed by a nitridation process performed on a HfSiO layer, wherein the Si constitutes 5 at % of the total content of Si and Hf, in $NH_3$ gas ambient at 750° C. for 60 seconds and by an annealing process at 950° C. for 30 seconds. That is, the "G sample" may be a main dielectric (10*t*, 110*t*, 210*t*, or 310*t*) formed according to embodiments of the inventive concept.

Referring to FIG. 9, it can be seen that the "F sample" is a monoclinic phase, and the "G sample" is a tetragonal phase. Thus, it can be seen that, compared to the "F sample" containing no Si, the "G sample" containing a small content of Si is a suitable phase for a high-k dielectric.

Meanwhile, it can be also seen that even though the "B sample" in FIG. 8 and Table 1 and the "G sample" in FIG. 9 have the same content of Si (that is, 5% of the total content of Si and Hf); the "B sample," which is not treated by nitridation, is a monoclinic phase; and the "G sample," which is nitrified, is a tetragonal phase. Thus, the "G sample" according to embodiments of the inventive concept is more suitable as a dielectric having a high dielectric constant than the "B sample," which is not treated by nitridation.

The "D sample" of Table 1 and the "G sample" of FIG. 8 both have tetragonal phases, but the Si content is lower in the "G sample" than in the "D sample"; consequently, the dielectric constant of the "G sample" is higher than that of the "D sample".

Thus, according to embodiments of the inventive concept, a high-k dielectric having a low content of Si and a tetragonal phase may be provided.

A semiconductor device according to embodiments of the inventive concept may be realized as various types of devices and/or systems are used as a component of the various devices and/or systems. For example, the semiconductor device may be applied to realize various types of memory devices, for example, a memory card, a USB memory, and a solid-state driver (SSD).

Figure 10:
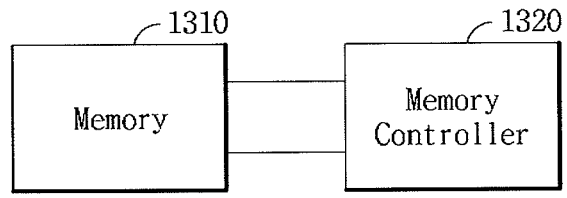
FIGS. 10 through 17 are schematic diagrams of a device and a system including a semiconductor device according to embodiments of the inventive concept.

FIG. 10 is a schematic diagram of a memory 1310 and a memory controller 1320. The memory 1310 may include a high-k dielectric formed according to one of the embodiments of the inventive concept. For example, a gate dielectric layer of a MOS transistor and/or a dielectric layer of a capacitor constituting the memory 1310 may include a high-k dielectric formed according to one of the embodiments of the inventive concept. When the memory 1310 includes a flash memory device, a dielectric in a memory cell constituting the flash memory device may include a high-k dielectric formed according to one of the embodiments of the inventive concept.

The memory controller 1320 may provide an input signal controlling operation of the memory 1310. For example, the memory controller 1320 may provide a command and an address signal. The memory controller 1320 may control the memory 1310 in response to a received control signal.

The memory 1310 and/or the controller 1320 may be mounted using packages in various forms. For example, the memory 1310 and/or the controller 1320 may be mounted using packages, such as Package on Packages (PoPs), Ball grid arrays (BGAs), Chip scale packages (CSPs), Plastic Leaded Chip Carriers (PLCCs), Plastic Dual In-Line Packages (PDIPs), Die in Waffle Packs, Die in Wafer Forms, Chip On Boards (COBs), Ceramic Dual In-Line Packages (CERDIPs), Plastic Metric Quad Flat Packs (MQFPs), Thin Quad Flatpacks (TQFPs), Small Outlines (SOICs), Shrink Small Outline Packages (SSOPs), Thin Small Outlines (TSOPs), Thin Quad Flatpacks (TQFPs), System In Packages (SIPs), Multi Chip Packages (MCPs), Wafer-level Fabricated Packages (WFPs), and Wafer-Level Processed Stack Packages (WSPs).

Figure 11:
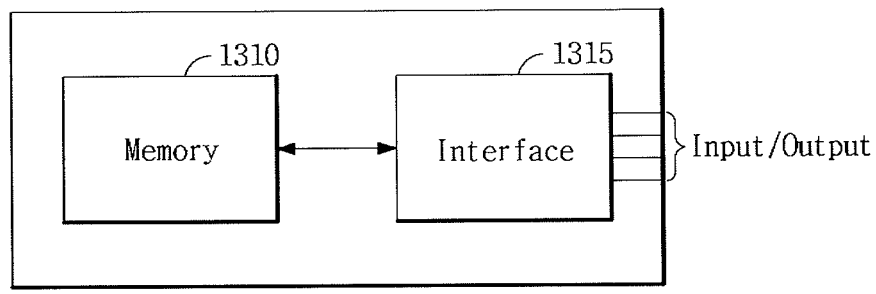

FIG. 11 schematically shows a device including a memory 1310 connected to an interface 1315. The memory 1310 may include a high-k dielectric formed according to one of the embodiments of the inventive concept. The interface 1315 may provide an input signal generated from outside. For example, the interface 1315 may provide a command and an address signal.

Figure 12:
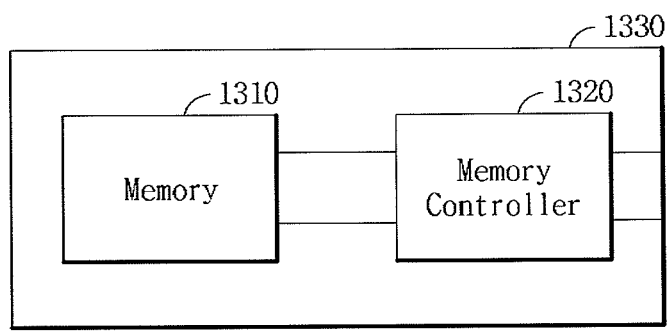

FIG. 12 is a schematic diagram of a memory card 1330. The memory 1310 and the memory controller 1320 described with reference to FIG. 10 may be realized as a memory card 1330. The memory card 1330 may be an electronic device, for example, a memory card used for a device such as a digital camera or a computer.

Figure 13:
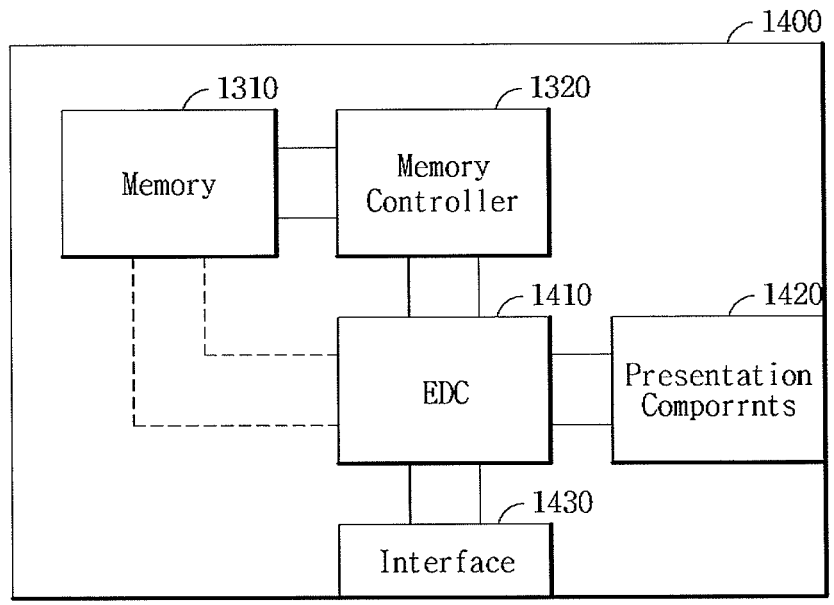

FIG. 13 is a schematic diagram of a portable device 1400. The portable device 1400 may be an MP3 player, a video player, or a video and audio player. The portable device 1400 may include a memory 1310 and a memory controller 1320. The memory 1310 may include a high-k dielectric formed according to one of the embodiments of the inventive concept. The portable device 1400 may include an encoder and decoder (EDC) 1410, an expressing unit 620, and an interface 630. Video or audio data may be sent and received between the memory 1310 and the EDC 1410 via the memory controller 1320. As shown with a dotted line, data may be directly sent and received between the memory 1310 and the EDC 1410.

The EDC 1410 may encode data stored in the memory 1310. For example, the EDC 1410 may encode audio data in MP3 format, and store the data in the memory 1310. In addition, the EDC 1410 may encode video data in MPEG format (e.g., MPEG3 or MPEG4) and store the data in the memory 1310. The EDC 1410 may include various encoders encoding different types of data according to data formats. For example, the EDC 1410 may include an MP3 encoder for audio data and an MPEG encoder for video data. The EDC 1410 may decode data output from the memory 1310. For example, the EDC 1410 may decode the audio data output from the memory 1310 in MP3 format.

The EDC 1410 may decode the video data output from the memory 1310 in MPEG format (e.g., MPEG3 or MPEG4). The EDC 1410 may include various decoders decoding various types of data according to data formats. For example, the EDC 1410 may include an MP3 decoder for audio data and an MPEG decoder for video data. The EDC 1410 may include only a decoder. For example, after the encoded data is delivered to the EDC 1410 and decoded, the data may be delivered to the memory controller 1320 and/or the memory 1310.

The EDC 1410 may receive data to be encoded via the interface 1430 or the encoded data. The interface 1430 may follow well-known standards (e.g., USB, or firewire). The interface 1430 may include at least one interface. The data provided from the memory 1310 may be output via the interface 1430.

The expressing unit 1420 may display data decoded by the memory 1310 and/or the EDC 1410, wherein that displayed data may be recognized by a user. For example, the expressing unit 1420 may include a display screen outputting video data and/or a speaker jack outputting audio data.

Figure 14:
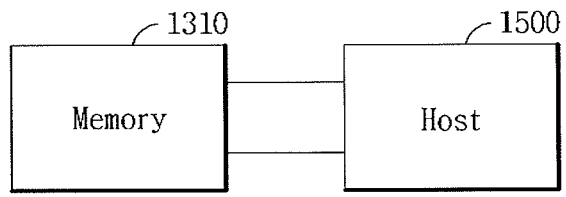

FIG. 14 is a schematic diagram of a host system 1500 connected with the memory 1310. The memory 1310 may include a high-k dielectric formed according to one of the embodiments of the inventive concept. The memory 1310 may be a detachable memory medium, such as a memory card, a USB memory, or a SSD. The host system 1500 may be a processing system, such as a computer or a digital camera. The host system 1500 may provide a command and an address signal.

Figure 15:
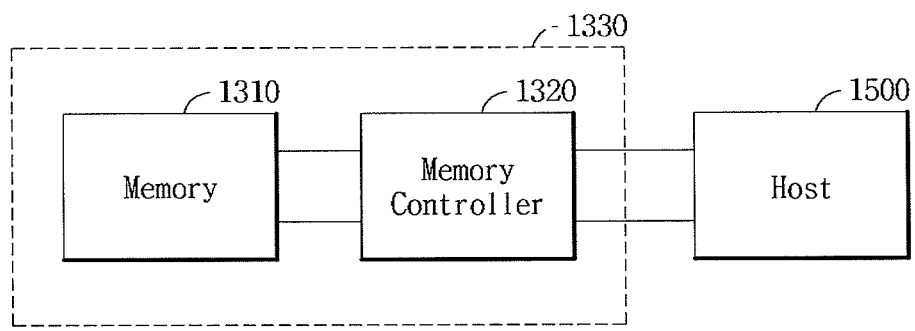

FIG. 15 is a schematic diagram of a host system 1500 connected with the memory card 1330. The host system 1500 may be connected with the memory card 1330 described in FIG. 12. The host system 1500 may provide a control signal to the memory card 1330 and control the operation of the memory controller 1320 and the memory 1310.

Figure 16:
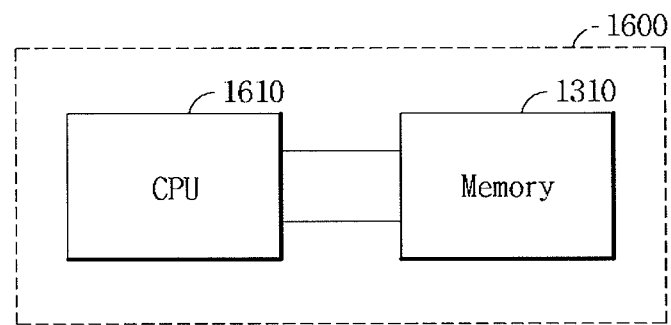

FIG. 16 is a schematic diagram of a computer system 1600. The memory 1310 may be connected with a central processing unit (CPU) 1610 in the computer system 1600. For example, the computer system 1600 may be a personal computer or a personal data assistant. The memory 1310 may be connected with the CPU 1610 through a BUS.

Figure 17:
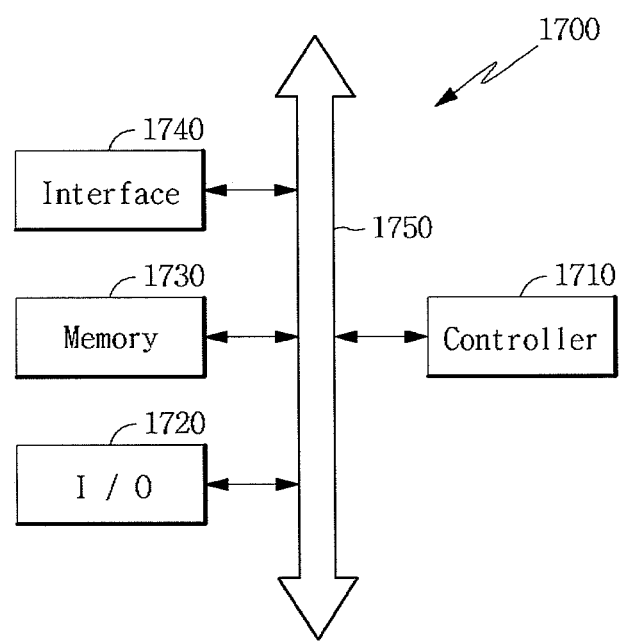

FIG. 17 is a schematic diagram of a device 1700 including a controller 1710, an input/output device 1720, a memory 1730, and an interface 1740. The components in the device 1700 may be connected with each other through a BUS 1750.

The memory 1730 may include a high-k dielectric formed according to one of the embodiments of the inventive concept. The input/output device 1720 may be a device such as a keyboard or a display. The controller 1710 may include at least one micro processor, digital processor, micro controller or processor. The memory 1730 may store data or a command executed by the controller 1710. The interface 1740 may be used to send data to another system, for example, to send data to a communication network or receive data from a communication network.

The device 1700 may be a mobile system such as a PDA, a portable computer, a web tablet, a wireless phone, a mobile phone, a digital music player, a memory card, or a system capable of transceiving data.

According to embodiments of the inventive concept, a first-phase preliminary dielectric is formed and nitrified to be phase-changed to a second phase having a higher dielectric constant than the first phase, thereby forming a high-k dielectric. Thus, the high-k dielectric having a phase that is thermally stable and an increased dielectric constant can be provided.

The foregoing is illustrative of embodiments and is not to be construed as limiting thereof. Although a few embodiments have been described, those skilled in the art will readily appreciate that many modifications are possible in embodiments without materially departing from the novel teachings and advantages. For example, in some instances where a particular embodiment of the invention includes a plurality of system elements or method steps, those elements or steps may be replaced with a single element or step; likewise, a single element or step may be replaced with a plurality of elements or steps that serve the same purpose. Moreover, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor device, comprising:
    forming an underlying layer;
    forming a preliminary dielectric including hafnium (Hf), oxygen (O) and an "A" element on the underlying layer, wherein the preliminary dielectric is formed in an amorphous structure or a mixed structure of an amorphous structure and an "M" crystalline structure, and the "A" element constituting about 1 at % to about 5 at % of the total content of the "A" element and hafnium (Hf) in the preliminary dielectric;
    performing a nitridation process to add nitrogen to the preliminary dielectric;
    performing a phase transition process to change the nitrogen-containing preliminary dielectric into a "T" crystalline dielectric having a "T" crystalline structure, which is different from the "M" crystalline structure; and
    forming an upper layer on the "T" crystalline dielectric.

2. The method of claim 1, wherein the "A" element comprises at least one of silicon (Si), yttrium (Y), gadolinium (Gd), aluminum (Al), and zirconium (Zr).

3. The method of claim 1, wherein the "M" crystalline structure is a monoclinic crystalline structure.

4. The method of claim 1, wherein the "T" crystalline structure is a tetragonal or cubic crystalline structure.

5. The method of claim 1, wherein the phase transition process is performed at about 700° C. to about 1100° C.

6. The method of claim 1, wherein the phase transition process is performed at about 900° C. to about 1100° C.

7. The method of claim 1, wherein, before forming the preliminary dielectric, a buffer layer is formed on the underlying layer, the buffer layer including silicon oxide or silicon oxynitride.

8. The method of claim 1, wherein, before forming the upper layer, a capping layer is formed on the preliminary dielectric or on the "T" crystalline dielectric.

9. The method of claim 1, further comprising, before forming the preliminary dielectric, forming a lower dielectric having an amorphous structure on the underlying layer,
    wherein the lower dielectric comprises Hf, O, and a "B" element that comprises at least one of Si, Y, Gd, Al and Zr, the "B" element constituting a higher percentage of the total content of the "B" element and Hf in the lower dielectric than the "A" element constitutes of the total content of the "A" element and Hf in the preliminary dielectric, and the lower dielectric maintaining the amorphous structure during and after the phase transition process, and
    wherein the lower dielectric is directly in contact with the "T" crystalline dielectric.

10. The method of claim 9, wherein the "B" element constitutes about 20 at % to about 50 at % of the total content of the "B" element and Hf in the lower dielectric.

11. The method of claim 1, further comprising, before forming the upper layer, forming an upper dielectric having an amorphous structure on the preliminary dielectric, wherein the upper dielectric comprises Hf, O and a "C" element, nitrogen is implanted and doped into the upper dielectric during the nitridation process to form a nitrogen-containing upper dielectric, the "C" element comprising at least one of Si, Y, Gd, Al and Zr, and the "C" element constituting a higher percentage of the total content of the "C" element and Hf in the upper dielectric than the "A" element constitutes of the total content of the "A" element and Hf in the dielectric, and the upper dielectric maintaining an amorphous structure during and after the phase transition process, and wherein the upper dielectric is directly in contact with the "T" crystalline dielectric.

12. The method of claim 11, wherein the "C" element constitutes about 20 at % to about 50 at % of the total content of the "C" element and Hf in the upper dielectric.

13. The method of claim 1, further comprising:
forming an amorphous lower dielectric on the underlying layer before forming the preliminary dielectric; and
forming an amorphous upper dielectric on the preliminary dielectric before forming the upper layer,
wherein nitrogen is implanted or doped into the lower and upper dielectrics during the nitridation process, and the lower and upper dielectrics maintain amorphous structures during and after the phase transition process, and
wherein the lower dielectric is directly in contact with the "T" crystalline dielectric.

14. The method of claim 1, wherein the underlying layer comprises a semiconductor region, wherein at least a part of the semiconductor region overlaps the dielectric, and wherein the upper layer is formed of a conductive material.

15. The method of claim 1, wherein the underlying layer is formed of a first conductive material, and the upper layer is formed of a second conductive material that is different from the first conductive material.

16. A method of forming a dielectric, comprising:
forming a HfSiO layer in an amorphous structure or in a mixed structure of an amorphous structure and a monoclinic crystalline structure, Si constituting about 1 at % to about 5 at % of the total content of Si and Hf in the HfSiO layer;
performing a nitridation process on the HfSiO layer to add nitrogen to the HfSiO layer, forming a HfSiON layer; and
performing a phase transition process, phase-changing the HfSiON layer having the amorphous structure into a HfSiON layer having a tetragonal crystalline structure,
wherein the tetragonal HfSiON layer is substantially free of the monoclinic crystalline structure.

17. The method of claim 16, further comprising:
forming an amorphous barrier HfSiO layer before or after forming the HfSiO layer; and
adding nitrogen to the barrier HfSiO layer to form a barrier HfSiON layer during the nitridation process,
wherein the barrier HfSiON layer maintains an amorphous structure during and after the phase transition process, Si constituting a higher percentage of the total content of Si and Hf in the barrier HfSiON layer than the total content of Si and Hf in the tetragonal HfSiON layer.

* * * * *